United States Patent
Francese (10) Patent No.: US 9,584,346 B2
(45) Date of Patent: Feb. 28, 2017

(54) DECISION-FEEDBACK EQUALIZER

(71) Applicant: International Business Machines Corporation, Armonk, NY (US)

(72) Inventor: Pier Andrea Francese, Adliswil (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/799,683

(22) Filed: Jul. 15, 2015

(65) Prior Publication Data

US 2017/0019276 A1    Jan. 19, 2017

(51) Int. Cl.
*H04L 25/03* (2006.01)
*H03K 5/24* (2006.01)

(52) U.S. Cl.
CPC ..... *H04L 25/03063* (2013.01); *H03K 5/2481* (2013.01); *H04L 25/03057* (2013.01)

(58) Field of Classification Search
CPC ......... H04L 25/03057; H04L 25/03267; H04L 25/03025; H04L 25/03012; H04L 25/03019; H04L 2025/03484; H04L 2025/0349; H04L 25/03121; H04L 25/03146; H04L 25/03063; H03K 5/2481
USPC ................... 375/232, 233, 348, 350
See application file for complete search history.

(56) References Cited

U.S. PATENT DOCUMENTS

| | | | |
|---|---|---|---|
| 7,720,142 B2 | 5/2010 | Mobin et al. | |
| 8,121,186 B2 | 2/2012 | Chmelar et al. | |
| 8,457,190 B2 * | 6/2013 | Raghavan | H04L 25/03057 |
| | | | 375/233 |
| 8,902,963 B2 | 12/2014 | Aziz et al. | |
| 8,917,762 B2 | 12/2014 | Francese et al. | |
| 8,934,527 B2 | 1/2015 | Abnous et al. | |
| 2008/0094107 A1 * | 4/2008 | Dallaire | H03K 5/2481 |
| | | | 327/63 |
| 2013/0243070 A1 * | 9/2013 | Ito | H04L 27/01 |
| | | | 375/233 |

(Continued)

OTHER PUBLICATIONS

G.R. Gangasani et al., "A 32-Gb/s Backplane Transceiver with On-chip AC coupling and Low Latency CDR in 32-nm SOI CMOS Technology," IEEE Journal of Solid-State Circuits, pp. 2474-2489, vol. 49, No. 11, Nov. 2014.

(Continued)

*Primary Examiner* — Betsy Deppe
(74) *Attorney, Agent, or Firm* — Daniel P. Morris, Esq.; Otterstedt, Ellenbogen & Kammer, LLP (57) ABSTRACT

A decision-feedback equalizer for use in a receiver unit for receiving an incoming data stream and for providing a stream of bit data outputs includes a plurality of asynchronous comparators and a fastest decision detector unit operatively coupled with the asynchronous comparators. Each of the asynchronous comparators is configured to receive an input signal and to directly provide a comparison result output in an asynchronous manner. The fastest decision detector unit is configured for receiving at least a subset of the respective comparison result outputs of the asynchronous comparators and for forwarding the comparison result of one of the asynchronous comparators towards the output of the decision-feedback equalizer. The fastest decision detector unit is configured to select a given one of the asynchronous comparators as one which firstly provided its comparison result output.

20 Claims, 7 Drawing Sheets

(56) References Cited

U.S. PATENT DOCUMENTS

2014/0269889 A1 9/2014 Xu et al.
2015/0180642 A1* 6/2015 Hsieh .................. H04L 7/0025
                                                      375/233

OTHER PUBLICATIONS

T. Toifl et al., "A 3.1mW/Gbps 30Gbps quarter-rate triple-speculation 15-tap SC-DFE RX data path in 32nm CMOS," VLSI Circuits (VLSIC), 2012 Symposium on, pp. 102-103, Jun. 2012.

P.A. Francese et al., "A 16 Gb/s 3.7 mW/Gb/s 8-Tap DFE Receiver and Baud-Rate CDR With 31 kppm Tracking Bandwidth," IEEE Journal of Solid-State Circuits, pp. 2490-2502, vol. 49, No. 11, Dec. 2014.

Yue Lu et al., "A 66Gb/s 46mW 3-tap decision-feedback equalizer in 65nm CMOS," Solid-State Circuits Conference Digest of Technical Papers (ISSCC), 2013 IEEE International, pp. 30-32, Feb. 2013.

Jinxing Guo et al., "A 25Gb/s adaptive decision feedback equalizer for 100G Ethernet in 65NM CMOS technology," Solid-State and Integrated Circuit Technology (ICSICT), 2014 12th IEEE International Conference on, pp. 1-3, Oct. 2014.

Xuelin Zhang et al., "A 6.25-Gbps 4-tap low-power decision feedback equalizer in 0.13μm CMOS technology," Electron Devices and Solid-State Circuits (EDSSC), 2013 IEEE International Conference of, pp. 1-2, Jun. 2013.

* cited by examiner

DECISION-FEEDBACK EQUALIZER

BACKGROUND

The present invention relates generally to the electrical, electronic and computer arts, and, more particularly, to implementations of decision feedback equalizers for high-speed data transmission.

Modern data networks require high-speed data communication with serial link data rates of more than 10 Gbit/s. In this bandwidth range, a further increase of serial link data rates is challenging due to the limited general bandwidth. The general bandwidth is usually determined by dielectric losses and reflections on the transmission channel which result in a widening of the transmitted signal pulses over more than one unit interval, so that the received signal is distorted by intersymbol interference (ISI).

These signal distortions are usually compensated for by means of equalizing functions in the receiving circuitry, such as feed-forward equalizing and decision-feedback equalizing. A decision-feedback equalizer (DFE) is capable of reducing signal distortions while leaving noise and crosstalk unaffected.

In general, a decision-feedback equalizer is included in the data path of incoming data and is substantially configured to compensate for the effects of one transmitted pulse onto one or more succeeding pulses of the incoming data stream of digitalized data samples. The general concept of a decision-feedback equalizer implementation is to provide at least one comparator used to translate the single pulses of the stream of digitalized data samples into a bit stream. By means of the comparator, the digitalized data samples are each compared with a respective variable threshold value, which may be generated depending on the preceding (history of) data samples tapped from the output of the decision-feedback equalizer. The variable threshold value is obtained by delaying the bit outputs of the decision-feedback equalizer by one or more clock cycles in a number of delay stages, by weighting each of the delayed bit outputs of the decision-feedback equalizer after each stage by a predetermined (preset) coefficient and by then adding the results. The coefficients are adapted to a standard pulse response of the specific transmission channel.

An additional approach, known as speculation or loop-unrolling, is to precompute the variable threshold values for each pattern of delayed DFE bit outputs. Speculation or loop-unrolling for DFE is a technique that implements all possible weighted summations at the output of a finite impulse response (FIR) filter in the DFE feedback path in order to reduce the critical path time of the DFE coefficients' summation time. All possible combinations of N post-cursors (N taps) intersymbol interference terms are accordingly generated in a speculative decision-feedback equalizer of the order N, so that a total of $2^N$ combinations or speculations are generated, where N is an integer. The correct decision is selected among the $2^N$ speculations on the basis of the last N decisions. This approach should help to save area and power impact of the line of adding circuits. However, hardware complexity grows exponentially with the number N of taps; i.e., the number of considered historical data samples. As for each of the threshold values a separate comparator latch is needed, the outputs of which are to be selected by a multiplexer, the overall circuitry has the disadvantage of requiring a large circuit area and having high power consumption.

U.S. Pat. No. 8,121,186 B2 discloses a speculative digital DFE circuit which is operable to reduce intersymbol interference without the timing constraints exhibited by existing DFE circuits. In particular, speculative digital DFE circuit operates to pre-calculate two competing adjustment feedback values-one based on a speculation that the result from processing the succeeding bit (i.e., a decision output) will be logic "1" and the other based on a speculation that the result from processing the succeeding bit will be logic "0." Once the result from the succeeding bit is available, the pre-calculated adjustment feedback value corresponding to the correctly speculated output value can be immediately selected to process the subsequent input bits. In this way, latency between determination of a succeeding bit and providing a data dependent input for processing a subsequent bit can be greatly reduced as the time required to perform adjustment calculations is effectively eliminated from the latency.

SUMMARY

According to a first aspect, a decision-feedback equalizer for use in a receiver unit for receiving an incoming data stream and for providing a stream of data outputs is provided. The decision-feedback equalizer includes a plurality of asynchronous comparators, each comparator receiving an input signal and directly providing a comparison result output in an asynchronous manner. The decision-feedback equalizer further includes a fastest decision detector unit for receiving each of the comparison result outputs of the plurality of asynchronous comparators and for forwarding the comparison result of one of the plurality asynchronous comparators towards the output of the decision-feedback equalizer. The fastest decision detector unit is configured to select the one of the plurality of asynchronous comparators as the one which firstly provided the respective comparison result; that is, the asynchronous comparator that provided the comparison result in the fastest time among the plurality of asynchronous comparators.

In one or more embodiments, the decision-feedback equalizer is based on a speculation or loop unrolling decision-feedback equalizer. Speculation or loop unrolling for decision-feedback equalizers is a technique that implements possible rated summations in a DFE feedback path in order to reduce the critical path time for calculating the DFE coefficients. All possible added combinations of a positive/negative main cursor and positive/negative N post-cursors (N tabs) intersymbol interference terms can be accordingly generated in the speculative decision feedback equalizer of the order N so that a total of $2^N$ combinations or speculations are generated. The intersymbol interference terms are used as threshold levels for a number of $2^N$ parallel comparisons with the input signal. One of the comparison results is selected to form the data output of the decision-feedback equalizer. In this manner, the selection is made as a function of information about how fast a regeneration of the voltage difference at the input of the asynchronous comparators has been performed, which mainly depends on the absolute value of the voltage difference between the provided threshold levels and the input signal voltage. Substantially, the one comparison result is selected which is based on the highest absolute value of the voltage difference at its inputs.

One possibility to accomplish this is the use of asynchronous comparators whose outputs are directly, i.e. without synchronization, connected with a fastest decision detector unit which detects which of the comparators has determined its comparison result in the fastest manner. Substantially, the overall speed of the decision feedback equalizer can be enhanced particularly when the delay of the fastest decision detector unit is less than the gain in the regeneration time by using the fastest decision of the asynchronous comparators.

It may be provided that each of at least a subset of the asynchronous comparators includes a regeneration circuit amplifying a voltage difference at its inputs and provide a comparison result at its output. In one or more embodiments, the regeneration circuit comprises a pair of cross-coupled inverters. Moreover, in one or more embodiments, each of the pair of cross-coupled inverters may be connected with a supply potential through a parallel connection of an input transistor whose control input is coupled with the input signal and a threshold transistor whose control input is coupled with a given threshold signal.

According to one or more embodiments, each of asynchronous comparators may be configured to be enabled and, after enabling, to amplify a voltage difference at its inputs and to asynchronously provide a comparison result at its output.

According to one or more embodiments, the fastest decision detector unit comprises: a pair of cross-coupled inverters which receives the comparison results of the asynchronous comparators so that as soon as one of the asynchronous comparators provides a valid comparison result, one branch of the pair of cross-coupled inverters is activated; and a selection unit to forward the comparison result to the output as a selected comparison result and to block comparison results depending on the branch of the cross-coupled inverters which has been activated.

Furthermore, in one or more embodiments, a clock recovery unit may be configured to provide a clock signal to all of the asynchronous comparators to thereby simultaneously initiate a comparing operation in each of the plurality of asynchronous comparators. Moreover, the clock recovery unit may be configured to provide the clock signal depending on the comparison results of all of the asynchronous comparators and depending on at least one of an actual and previous output of the decision-feedback equalizer.

A threshold level unit may be connected to an input of each of the asynchronous comparators to apply a respective threshold level so that an input signal applied on the asynchronous comparators is compared with respect to the corresponding threshold level.

Particularly, the threshold level unit may provide as threshold levels voltage levels of a first and a second logical state of the input signal for applying on two asynchronous comparators.

Additionally or alternatively, the threshold level unit may be connected to an input of each of the asynchronous comparators to apply a respective threshold level based on a main cursor threshold level and one of none, one and multiple post-cursor threshold levels so that an input signal applied on the asynchronous comparators is compared with respect to the corresponding threshold level, wherein a direct DFE feedback unit is provided to generate a direct feedback value to be applied on the input signal, wherein the direct feedback value is generated depending on post-cursor threshold levels which are not used to generate the threshold levels to be applied on the asynchronous comparators.

The threshold level unit may provide as threshold levels four voltage levels to four asynchronous comparators wherein as a threshold level a voltage level of a sum of a positive main-cursor threshold level and a positive post-cursor threshold level is applied on a first of the asynchronous comparators, wherein as a threshold level a voltage level of a sum of a negative main-cursor threshold level and a positive post-cursor threshold level is applied on a second of the asynchronous comparators, wherein as a threshold level a voltage level of a sum of a positive main-cursor threshold level and a negative post-cursor threshold level is applied on a third of the asynchronous comparators, wherein as a threshold level a voltage level of a sum of a negative main-cursor threshold level and a negative post-cursor threshold level is applied on a fourth of the asynchronous comparators.

According to an embodiment the first and second asynchronous comparators may be connected with a first fastest decision detector unit and the third and fourth asynchronous comparators are connected with a second fastest decision detector unit, wherein the respective outputs of the first and second fastest decision detector units are connected to inputs of a multiplexer, wherein one of the outputs of the first and second fastest decision detector units is selected depending on the level of a previous output data of the multiplexer.

The threshold level unit may be configured to calibrate threshold levels depending on the comparison results of each asynchronous comparator and/or depending on an actual or previous output of the decision feedback equalizer.

These and other features and advantages of the present invention will become apparent from the following detailed description of illustrative embodiments thereof, which is to be read in connection with the accompanying drawings.

BRIEF DESCRIPTION OF THE SEVERAL VIEWS OF THE DRAWINGS

The following drawings are presented by way of example only and without limitation, wherein like reference numerals (when used) indicate corresponding elements throughout the several views, and wherein.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present invention will be described herein in the context of illustrative decision-feedback equalizer (DFE) circuit topologies and methods for implementing a DFE. It is to be appreciated, however, that the invention is not limited to the specific apparatus and/or methods illustratively shown and described herein. Rather, it will become apparent to those skilled in the art given the teachings herein that numerous modifications can be made to the embodiments shown that are within the scope of the claimed invention. That is, no limitations with respect to the embodiments shown and described herein are intended or should be inferred.

Figure 1:
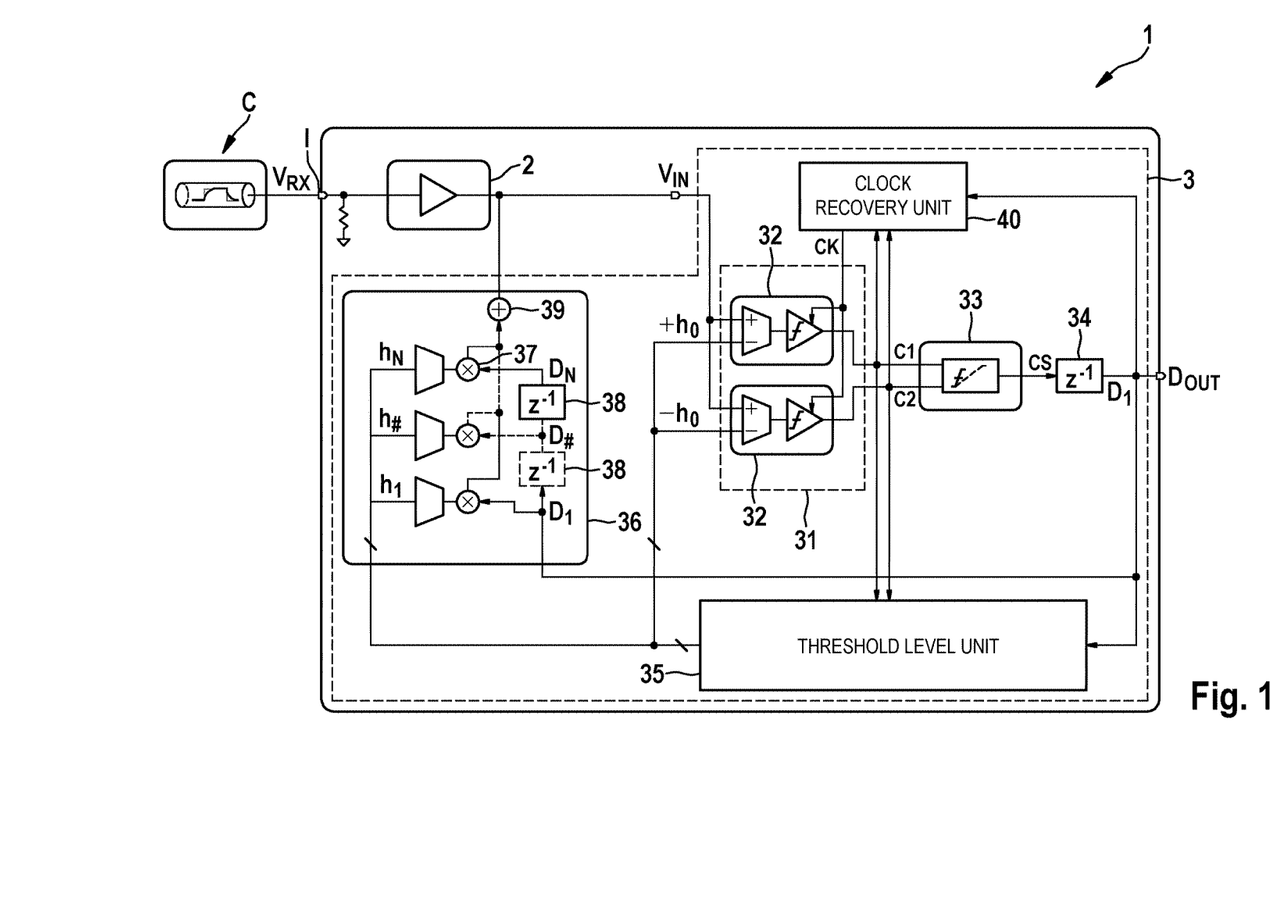
FIG. 1 shows a receiver unit with a decision-feedback equalizer applying asynchronous comparators and a fastest decision detector unit.

FIG. 1 shows at least a portion of an exemplary receiver unit (or receiver) 1 for use in an input stage of an integrated device. The receiver unit 1 is configured to receive an incoming data stream via a communications channel C to which the receiver unit 1 is operatively coupled. The incoming data stream results in a voltage representation of an input voltage $V_{RX}$ at an input port I of the receiver unit 1. In general, receiver units for high-speed data transmission purposes are designed using a differential implementation topology. However, single-ended implementations can also be applied complying with all aspects of the invention as described herein. For ease of illustration, a single-ended design is shown in the schematic drawings of the receiver units, with the understanding that the aspects described herein may be similarly applied to a differential circuit architecture, as will become apparent to those skilled in the art given the teachings herein.

The receiver unit 1 includes a simplified continuous time-linear equalizer 2 which is connected with the input port I of the receiver unit 1. The continuous time-linear equalizer 2 is preferably configured to equalize one or more signal portions over a prescribed bandwidth to thereby compensate for the attenuation of the transmission via the communications channel C.

Furthermore, the receiver unit 1 includes a decision-feedback equalizer 3 which is coupled downstream relative to the continuous time-linear equalizer 2 (i.e., in a direction away from the input port I, such as between the continuous time-linear equalizer 2 and an output port of the receiver unit 1) so that an input voltage $V_{IN}$ as an input signal is applied on a comparator stage 31. The comparator stage 31 has a plurality of asynchronous comparators 32; in the present embodiment, two asynchronous comparators 32. The equalized input voltage $V_{IN}$ of an output of the continuous time-linear equalizer 2 is simultaneously applied to the two asynchronous comparators 32 at its non-inverting inputs. At the inverting inputs of each of the asynchronous comparators 32, a respective first main-cursor threshold value $+h_0$, $-h_0$ is applied. Each of the asynchronous comparators 32 provides a respective comparison result output C1, C2 indicative of a difference between the input signal $V_{IN}$ and a corresponding one of the threshold values $+h_0$, $-h_0$ supplied thereto.

Substantially, as the terms are used herein, a cursor corresponds to the voltage at the center of a data bit. A main cursor corresponds to the voltage at the center of a data eye which refers to the transmitted data bit, while a post-cursor corresponds to the voltage at the center of a data eye following the data eye which refers to the transmitted data bit. A first to Nth post-cursor therefore corresponds to the first to Nth data eye following the data eye which refers to the transmitted data bit.

The asynchronous comparators 32 may be implemented as regeneration amplifiers which may be triggered by a clock signal CK so that comparison is initiated by the clock signal CK (e.g., by a corresponding edge of the clock signal CK). The asynchronous comparators 32 are configured to, once initiated by the clock signal CK, start comparison depending on a voltage potential difference between potentials at the non-inverting and inverting inputs. The comparators 32 are asynchronous as their operation is merely initiated by the clock signal CK, while the end of the comparison and the supplying of the comparison results C1, C2 is not synchronous to the clock signal CK so that the comparison results C1, C2 are respectively available as soon as the comparison process has been accomplished.

The comparison result outputs C1, C2 of the asynchronous comparators 32 are connected to a fastest decision detector unit 33. The fastest decision detector unit 33 is configured to select and output the comparison result of the one of the asynchronous comparators 32 which has been firstly provided the comparison result; that is, which made the fastest comparison decision based on the voltage potential difference at its respective non-inverting and inverting inputs.

The output of the fastest decision detector unit 33 corresponds to the comparison result of the selected asynchronous comparator 32 and is applied as the selected comparison result output CS on a delay element 34. The delay element 34 is configured to delay the selected comparison result output CS of the fastest decision detector unit 33 by one clock cycle of the clock signal CK. The delayed bit data output D1 of the delay element 34 may correspond to the output of the decision-feedback equalizer 3 and to the output of the receiver unit 1.

The main cursor threshold levels $+h_0$, $-h_0$ are supplied by a threshold level unit 35. The threshold level unit 35 is configured to process the delayed bit data output DO of the delay element 34 as well as the comparison result outputs C1, C2 of the asynchronous comparators 32 and determines the amplitude levels of the input voltage $V_{IN}$, i.e. the voltage levels of the representations of the high and low levels of the input signal.

The critical path which substantially determines the bandwidth of the decision-feedback equalizer 3, in this illustrative embodiment, is through the asynchronous comparators 32 and the fastest decision detector unit 33. Hence, a speed advantage compared to conventional decision feedback equalizers can be achieved when the additional delay of the fastest decision detector unit 33 is less than the improvement of the regeneration time of the asynchronous comparators 32; i.e., the time difference between the time when the fastest comparison result is available and the time when all comparison results are made available. The time when all comparison results are made available can be assumed to be the time when the comparison results of all comparators are latched to a selection multiplexer according to conventional synchronous approaches.

It may be provided a direct DFE feedback unit 36 to which a first $h_1$ to N-th post-cursor threshold levels $h_N$ are applied by the threshold level unit 35. Therein, the first to N-th post-cursor threshold levels $h_1 \ldots h_N$ are generated depending on the comparator results C1, C2 of the asynchronous comparators 32 and the delayed bit data output D1 and by analyzing the received data sequences.

The direct DFE feedback unit 36 has multiplying elements 37 in which the first to Nth post-cursor threshold levels $h_1 \ldots h_N$ are multiplied with the delayed bit data output D1 and subsequent delayed bit data outputs D2 ... DN which corresponds to the selected comparison result output CS delayed by 2 to N clock cycles, respectively, by means of further delay elements 38. The outputs of the multiplying elements 37 are collected and added in a summing element 39 which is applied on/added to the equalized input voltage $V_{IN}$ before it is applied onto the asynchronous comparators 32. Thereby, the effect of transmission channel dispersion can be directly considered in the input voltage $V_{IN}$ before it is evaluated to obtain the output of the decision-feedback equalizer 3.

The threshold level unit 35 may be configured to perform a calibration in a background operation. Background calibration can be implemented in different manners; e.g., by implementing two receivers one of which would be active while the other inactive and calibrated before being swapped in place of the first, as described in the paper G. R. Gangasani et al., "A 32-Gb/s Backplane Transceiver with On-chip AC coupling and Low Latency CDR in 32-nm SOI CMOS Technology," *IEEE Journal of Solid-State Circuits*, pp. 2474-2489, December 2014, the disclosure of which is incorporated herein by reference in its entirety. Another option for performing a calibration is implementing extra calibration paths such as "spy paths," as disclosed, for example, in the paper T. Toifl et al., "A 3.1 mW/Gbps 30 Gbps quarter-rate triple-speculation 15-tap SC-DFE RX data path in 32 nm CMOS," *Symp. VLSI Circuits Digest of Technical Papers*, pp. 102-103, 2012, the disclosure of which is incorporated by reference herein in its entirety.

The clock signal CK is provided by a baud-rate clock recovery unit 40 which is configured to provide a clock signal CK synchronous to the input signal $V_{RX}$. The baud-rate clock recovery unit 40 may be configured to avoid separate signal paths to detect and lock to the data clock phase and frequency. For example, as disclosed in P. A. Francese et al., "A 16 Gb/s 3.7 mW/Gb/s 8-Tap DFE Receiver and Baud-Rate CDR With 31 kppm Tracking Bandwidth," *IEEE Journal of Solid-State Circuits*, pp. 2490-2502, December 2014, the disclosure of which is incorporated herein by reference in its entirety, additional slicing levels placed at the edge of the speculative eye diagrams were implemented. Substantially, the baud-rate clock recovery unit 40 is configured to provide an edge of a clock signal at an instance defined by an edge of the speculative signal eye diagram depending on the comparison results C1, C2 of the asynchronous comparators 32 and the delayed bit data output D1.

The clock signal is generated in the baud-rate clock recovery unit 40 with a clock data recovery (CDR) control algorithm which may be implemented with $2^{nd}$-order loops (e.g., both phase and frequency is recovered and tracked). Particularly, in the baud-rate clock recovery unit 40 the timing information may be extracted by sampling the received data at a single phase position instead of two phase positions (e.g., one at the zero crossing and one at the maximum data amplitude).

The baud-rate clock recovery unit 40 provides the edge of a clock signal at an instance defined by an edge of the speculative signal eye diagram, so that when the asynchronous comparators 32 are triggered by the clock signal CK, one of the asynchronous comparators 32 experiences a decreasing voltage difference at its inputs while the other asynchronous comparator 32 experiences an increasing voltage difference at its inputs. The asynchronous comparator 32 which experiences the increasing voltage different at its input will obtain a comparison result much faster than the other asynchronous comparator 32 which can subsequently be detected by the fastest decision detection unit 33.

Figure 2A:
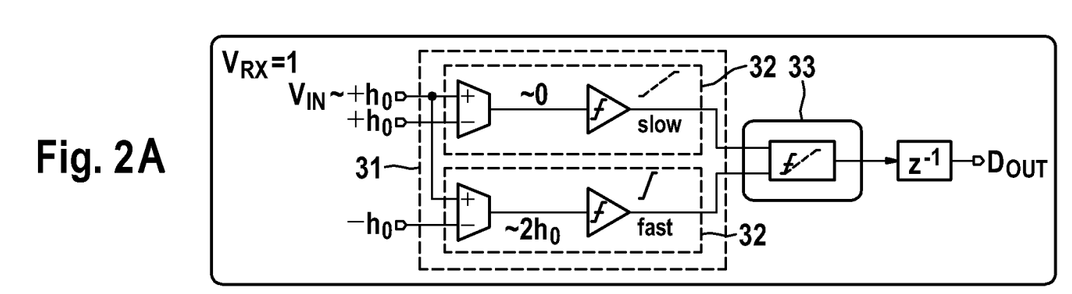
FIGS. 2A and 2B illustrate the effect of the use of an asynchronous comparator and the fastest decision detector unit for determining the DFE output in a receiver unit of FIG. 1 for different input voltages.
Figure 2B:
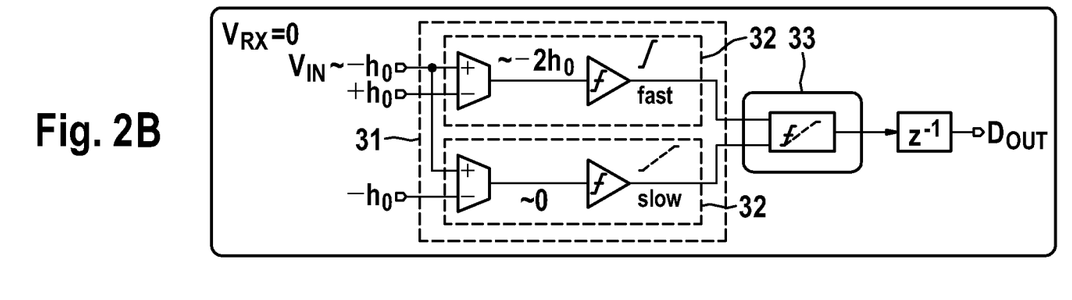

FIGS. 2A and 2B show two possible situations of the receiving signal $V_{RX}=1$ and $V_{RX}=0$ and its corresponding state at the inputs and the outputs of the asynchronous comparators 32 and at the inputs of the fastest decision detection unit 33. It can be seen that in the case that the receiving signal $V_{RX}$ equals 1, the input voltage $V_{IN}$ equals substantially the positive main cursor threshold level $+h_0$ so that a first of the asynchronous comparators 32 whose inverting input receives the positive main cursor threshold level $+h_0$ provides a comparison result C1 which equals substantially 0, while a second of the asynchronous comparators 32 whose inverting input receives the negative main cursor threshold level $-h_0$ provides the comparison result which equals about $2h_0$. These comparison results allow the second asynchronous comparator 32, i.e. an included regeneration unit, to make a quick decision about the sign of the voltage difference at its inputs as the comparison result, while the decision of the first asynchronous comparator will be slow. As the comparison results C1 and C2 are supplied to the input of the fastest decision detection unit 33, the comparison result of the quickest decision is selected.

In the case the receiving signal $V_{RX}$ equals 0, analogously, the input voltage $V_{IN}$ equals substantially the negative main cursor threshold level $-h_0$ so that a first of the asynchronous comparators 32 whose inverting input receives the positive main cursor threshold level $+h_0$ provides a comparison result C1 which equals substantially $-2h_0$, while a second of the asynchronous comparators 32 whose inverting input receives the negative main cursor threshold level $-h_0$ provides the comparison result which equals about 0. This comparison result allows the first asynchronous comparator, i.e. an included regeneration unit, to make a quick decision about the sign of the voltage difference at its inputs as the comparison result, while the decision of the second asynchronous comparator will be slow. As the comparison results C1 and C2 are supplied to the input of the fastest decision detection unit 33, the comparison result of the quick decision is selected.

Figure 3:
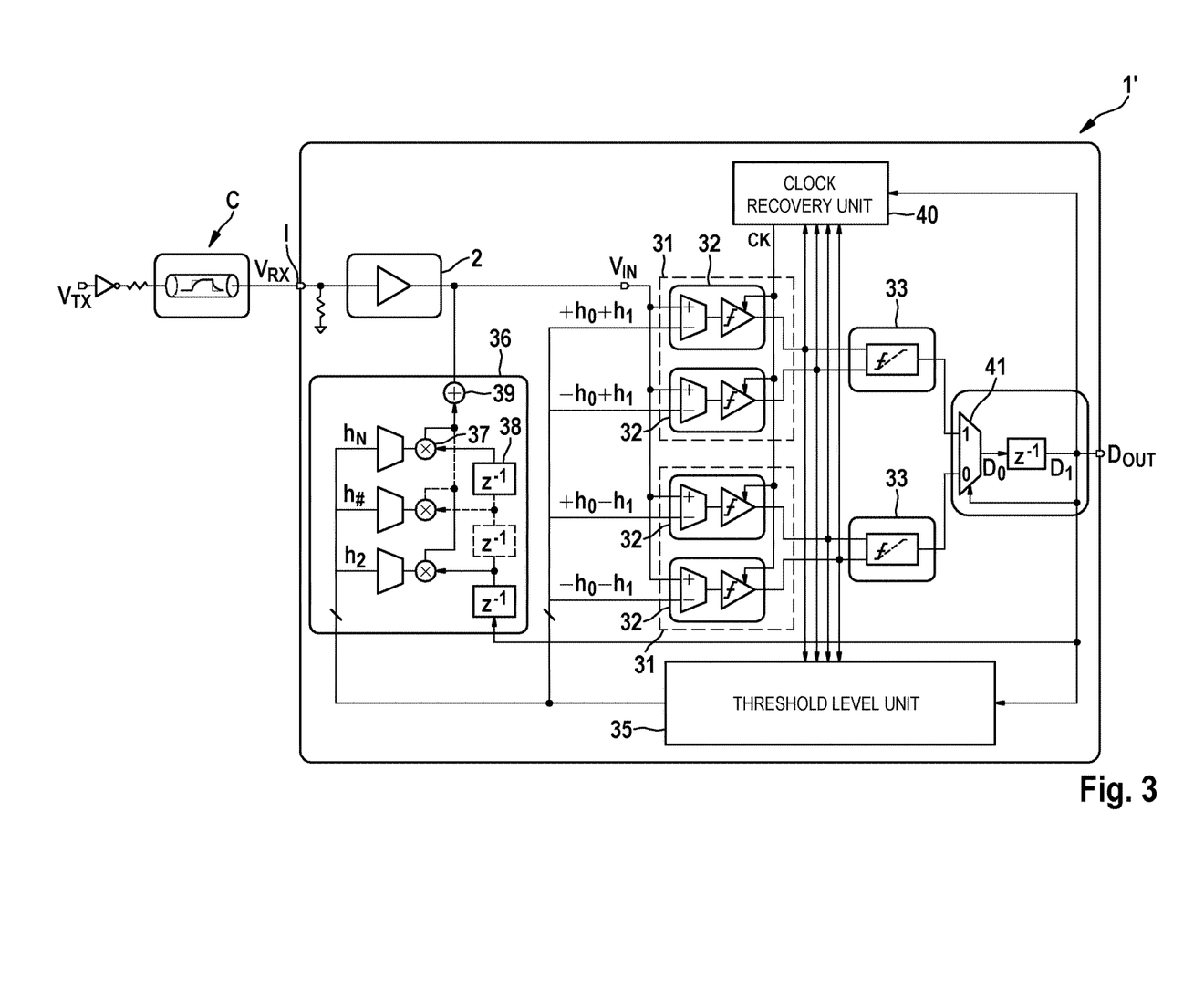
FIG. 3 shows another receiver unit including a $h_1$ speculation and applying asynchronous comparators and a fastest decision detector unit.
Figure 4A:
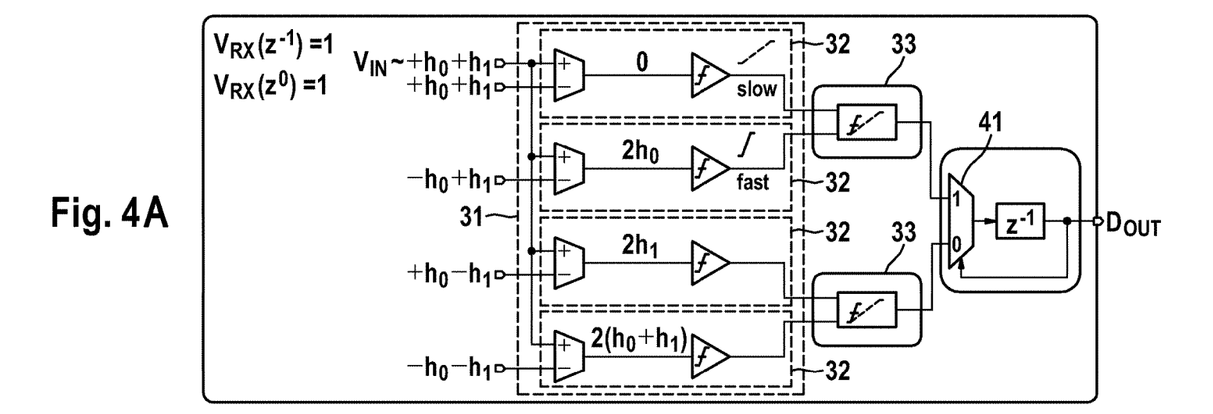
FIGS. 4A-4D illustrate the effect of the use of an asynchronous comparator and the fastest decision detector unit for determining the DFE output in a receiver unit of FIG. 3.
Figure 4B:
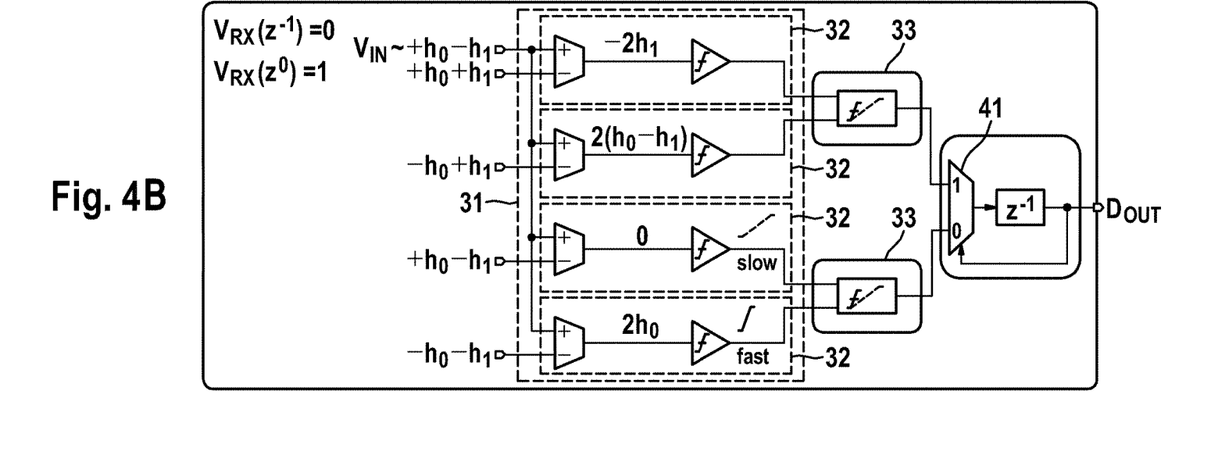
Figure 4C:
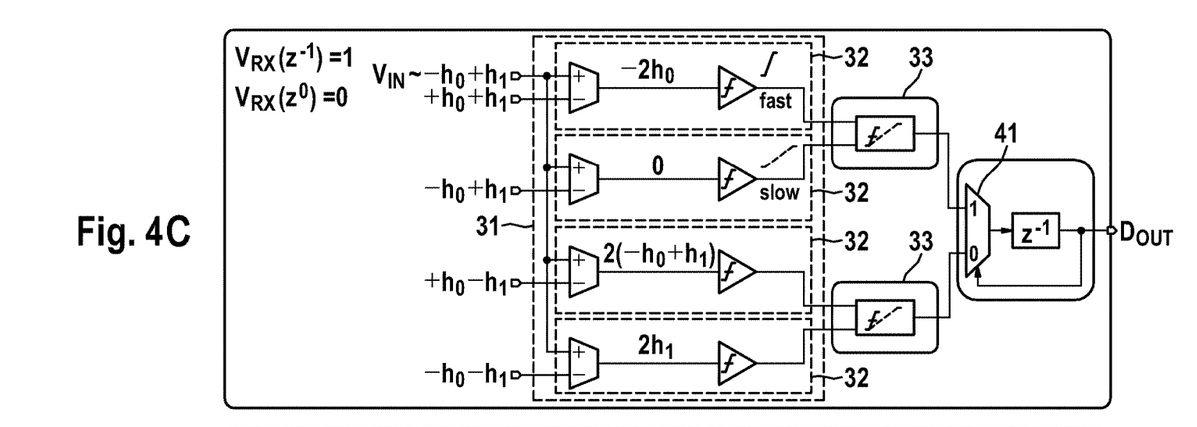
Figure 4D:
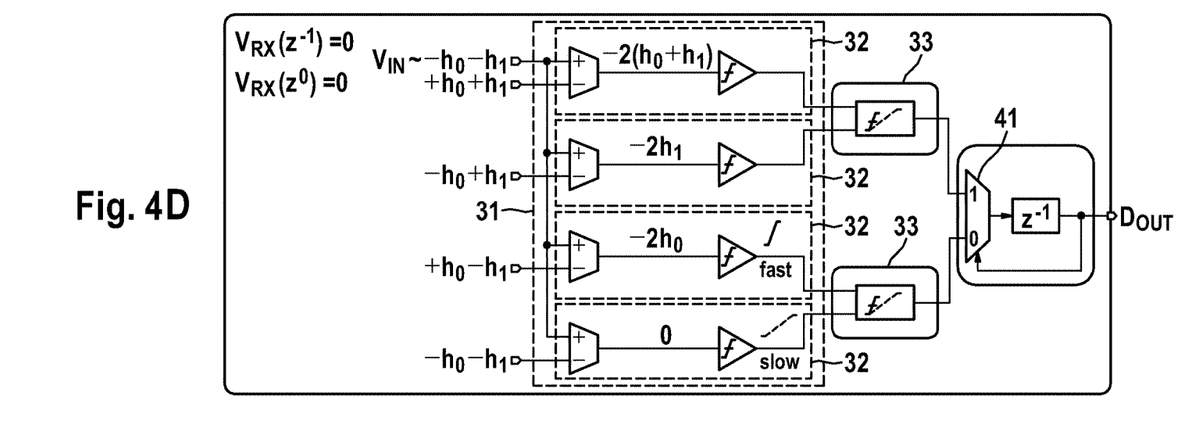

In FIG. 3, a further receiver unit 1' is shown. For ease of explanation, the same components are indicated with the same reference sign. Substantially, the difference of the receiver unit 1' of FIG. 3 to the receiver unit 1 of FIG. 1 is that a first post-cursor speculation is implemented. Correspondingly, four combined threshold levels $+h_0+h_1$, $-h_0+h_1$, $+h_0-h_1$, $-h_0-h_1$ are provided by the threshold level unit 35 which are applied to inverting inputs of respective four asynchronous comparators 32 whose non-inverting inputs are applied with the input voltage $V_{IN}$. The asynchronous comparators 32 are divided into two parallel comparator stages 31 each including two asynchronous comparators 32. The asynchronous comparators 32 of each comparator stages 31 are connected with a respective one fastest decision detector unit 33. Hence, two fastest decision detecting units 33 are provided whose outputs are connected to a multiplexer 41. Thereby, the selected comparison outputs CS can be further selected by the multiplexer 41 by means of the delayed bit data output D1 (D0 delayed by one clock cycle).

The selection of the multiplexer 41 is made by the delayed bit data output D1 (D0 delayed by one cycle) as a 1-tap decision-feedback equalization (1-tap DFE) is implemented with a direct feedback.

The main cursor threshold levels $+h_0$, $-h_0$ substantially correspond to the signal levels of the logical 1 and the logical 0 so that the regeneration of a voltage difference based on the main cursor threshold levels $+h_0$, $-h_0$ may lead to a clear detection of the fastest comparison result. Therefore, the comparator stages 31 are defined by the threshold levels $+h_0+h_1$, $-h_0+h_1$, and $+h_0-h_1$, $-h_0-h_1$ applied at their respective non-inverting inputs, respectively. In case a direct DFE feedback unit 36 is provided, it only generates a feedback voltage based on the second $h_2$ to N-th post-cursor threshold levels $h_N$.

In FIGS. 4A-4D, similar to the illustration of FIGS. 2A and 2B, it is indicated the value at the outputs of the asynchronous comparators 32 with respect to the actual input signal $V_{Rx}(z^0)$ and the previous input signal $V_{Rx}(z^{-1})$ and if the comparison result is obtained fast or slow depending on the voltage difference at the inputs of the respective asynchronous comparator. Particularly, the situations for $(V_{Rx}(z^0)=1, V_{Rx}(z^{-1})=1)$, $(V_{Rx}(z^0)=1, V_{Rx}(z^{-1})=0)$, $(V_{Rx}(z^0)=0, V_{Rx}(z^{-1})=1)$, and $(V_{Rx}(z^0)=0, V_{Rx}(z^{-1})=0)$, respectively, are illustrated. By means of a selection of one of the two fastest decision detector units 33 by means of the multiplexer 41 the bit data output D0 and the delayed bit data output D1 is generated therefrom. It can be seen that for the selected comparator stage 31, the voltage differences are always 0 and $+/-2h_0$ so that due to the regeneration circuits the decision for the asynchronous comparator 32 is the faster the higher the absolute voltage at its inputs is.

Figure 5:
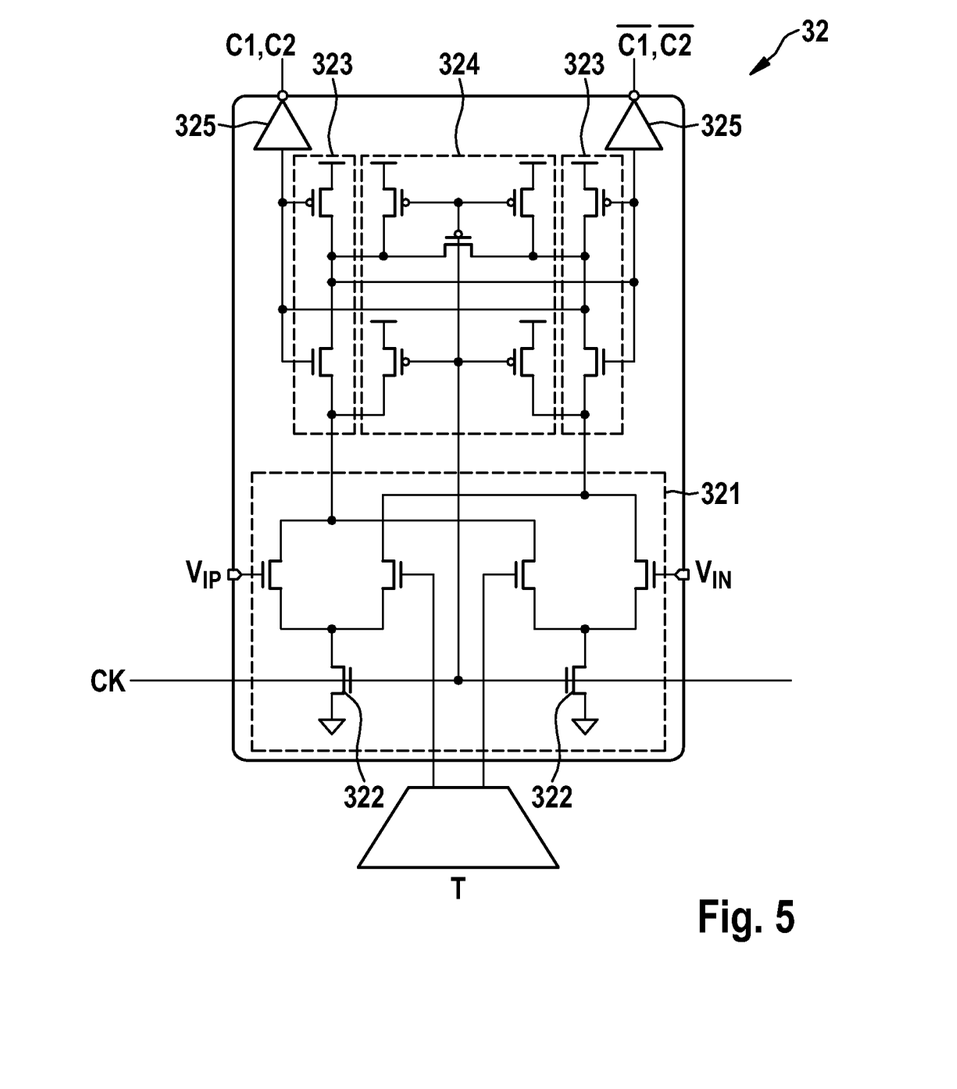
FIG. 5 schematically shows a possible circuitry of an asynchronous comparators for use in the receiver units of FIG. 1 and FIG. 3.

In FIG. 5, a differential circuitry of an exemplary asynchronous comparator 32 is shown which can be used in the receiver units 1, 1' of FIG. 1 and FIG. 3, according to one or more embodiments. The asynchronous comparator 32 may have a differential stage 321 at which the input voltage $V_{IN}$, $V_{IP}$ (differential input voltage) and the respective threshold levels T (i.e., one of $h_0$, $-h_0$, $+h_0+h_1$, $-h_0+h_1$, $+h_0-h_1$, $-h_0-h_1$) are applied. The differential stage 321 may be enabled by activating transistors 322 (e.g., via a logic high CK signal) thereby coupling the differential stage 321 to a supply potential such as, for example, ground potential GND in this illustrative embodiment. The differential stage 321 is coupled with a regeneration circuit which, in this illustrative embodiment, includes a pair of cross-coupled inverters 323 the outputs of which are connected with the fastest decision detector unit 33, for example via optional inverters 325. The inverters 323 are provided with reset circuitry 324 which may selectively couple all nodes of the regeneration circuit, which are not directly connected to a supply potential, to a supply potential on a reset. Reset can be determined by the clock signal CK. The operation of such an asynchronous comparator 32 is determined by the regeneration circuit, which in turn is determined by the cross-coupled inverters 323. A comparison result is obtained by separating the voltage potentials in the two branches which is performed the quicker, as indicative by a higher voltage difference between the input voltage $V_{IN}$, $V_{IP}$ and the respective threshold level T.

Figure 6:
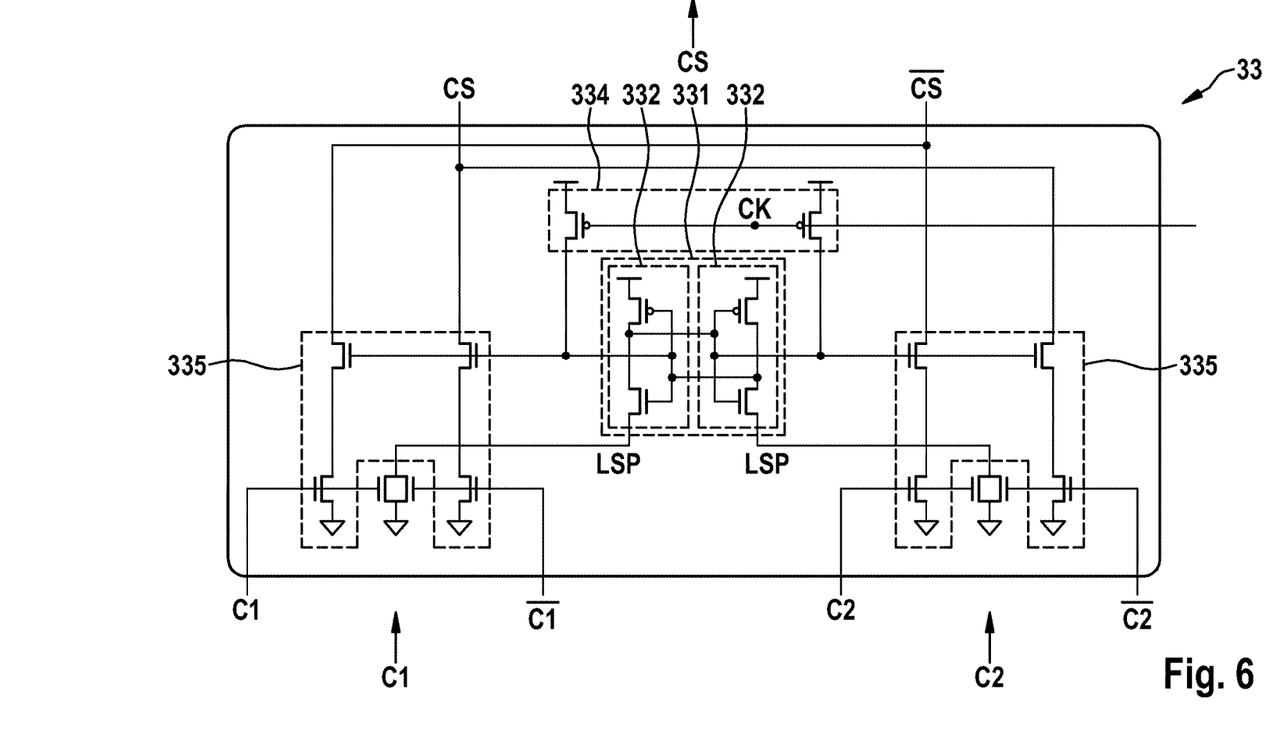
FIG. 6 schematically shows a possible circuitry for a fastest decision detector unit for use in the receiver units of FIG. 1 and FIG. 3.

FIG. 6 shows at least a portion of an exemplary circuit for implementing the fastest decision detector unit 33, according to one or more embodiments. The fastest decision detector unit 33 may receive the comparison results C1 and C2 as differential signals and provides one of the comparison results C1 and C2 as the selected comparison result CS at its differential output.

A main element of the fastest decision detector unit 33 is a pair 331 of cross-coupled inverters 332 which can be reset by a reset circuit 334 in a reset phase of operation. In a detection phase of operation, the reset circuit 334 is deactivated, according to one or more embodiments.

As the asynchronous comparators 32 do not show a differential output, which is before a comparison result has been determined, the cross-coupled inverters 332 are disabled as their low supply potential LSP terminals are floating. The outputs of the cross-coupled inverters are coupled with selection units 335 which connect one input of the fastest decision detector unit 33 to its output. As soon as one of the asynchronous comparators 32 provides a valid comparison result, one branch of the pair 331 of cross-coupled inverters 332 is provided with the low supply potential and the corresponding comparison result is forwarded through the respectively enabled selection unit 335 to the output.

Furthermore, the cross-coupled inverters 331 serve to keep the other selection unit 335 disabled independent of the slower comparison result of the respective other asynchronous comparator 32.

The cross-coupled inverters 331 are reset at every cycle to the high supply. After the reset when the CK signal transitions, for example, from low to high, the same cross-coupled inverters are in a metastable condition, and, as soon as the fastest decision is detected, they will regenerate such fastest decision and hold it regardless of any subsequent slow decision.

At least a portion of the techniques of the present invention may be implemented in an integrated circuit. In forming integrated circuits, identical die are typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Any of the exemplary circuits illustrated in the accompanying figures, or portions thereof, may be part of an integrated circuit. Integrated circuits so manufactured are considered part of this invention.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having sensor devices therein formed in accordance with one or more embodiments of the invention.

An integrated circuit in accordance with aspects of the present disclosure can be employed in essentially any application and/or electronic system where FPGAs are employed. Suitable systems for implementing embodiments of the invention may include, but are not limited to, Extensible Markup Language (XML) querying systems, Structured Query Language (SQL) query predicate evaluation systems, and spatiotemporal querying systems. Systems incorporating such integrated circuits are considered part of this invention. Given the teachings of the present disclosure provided herein, one of ordinary skill in the art will be able to contemplate other implementations and applications of embodiments of the invention.

The illustrations of embodiments of the invention described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. The drawings are also merely representational and are not drawn to scale. Accordingly, the specification and drawings are to be regarded in an illustrative rather than a restrictive sense.

Embodiments of the invention are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below" are used to indicate relative positioning of elements or structures to each other as opposed to relative elevation.

The corresponding structures, materials, acts, and equivalents of all means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the various embodiments with various modifications as are suited to the particular use contemplated.

The abstract is provided to comply with 37 C.F.R. §1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, inventive subject matter lies in less than all features of a single embodiment. Thus the following claims are hereby incorporated into the Detailed Description, with each claim standing on its own as separately claimed subject matter.

Given the teachings of embodiments of the invention provided herein, one of ordinary skill in the art will be able to contemplate other implementations and applications of the techniques of embodiments of the invention. Although illustrative embodiments of the invention have been described herein with reference to the accompanying drawings, it is to be understood that embodiments of the invention are not limited to those precise embodiments, and that various other changes and modifications are made therein by one skilled in the art without departing from the scope of the appended claims.

What is claimed is:

1. A decision-feedback equalizer for use in a receiver for receiving an incoming data stream and for providing a stream of bit data outputs, the decision-feedback equalizer comprising:

a plurality of asynchronous comparators, each of the asynchronous comparators being configured to receive an input signal and to directly provide a comparison result output in an asynchronous manner; and a fastest decision detector for receiving at least a subset of the respective comparison result outputs of the plurality of asynchronous comparators and for forwarding the comparison result of one of the plurality of asynchronous comparators towards the output of the decision-feedback equalizer;

wherein the fastest decision detector is configured to select a given one of the plurality of asynchronous comparators as one which firstly provided its comparison result output.

2. The decision-feedback equalizer according to claim 1, wherein each of at least a subset of the asynchronous comparators comprises a regeneration circuit configured to amplify a voltage difference at its inputs and to provide a comparison result at its output.

3. The decision-feedback equalizer according to claim 2, wherein the regeneration circuit comprises a pair of cross-coupled inverters.

4. The decision-feedback equalizer according to claim 3, wherein each of the cross-coupled inverters is connected with a supply potential through a parallel connection of an input transistor whose control input is coupled with the input signal and a threshold transistor whose control input is coupled with a prescribed threshold signal.

5. The decision-feedback equalizer according to claim 1, wherein each of at least a subset of the asynchronous comparators is configured to be enabled and, after being enabled, to amplify a voltage difference at its inputs and to asynchronously provide a comparison result at its output.

6. The decision-feedback equalizer according to claim 1, wherein the fastest decision detector comprises:

a pair of cross-coupled inverters configured to receive at least the subset of the respective comparison result outputs of the plurality of asynchronous comparators and to activate one branch of the pair of cross-coupled inverters once one of the asynchronous comparators provides a valid comparison result; and a selection circuit configured to forward the comparison result to the output as a selected comparison result and to block comparison results as a function of the branch of the cross-coupled inverters which has been activated.

7. The decision-feedback equalizer according to claim 1, wherein a clock recovery circuit is configured to provide a clock signal to at least a subset of the asynchronous comparators to simultaneously initiate a comparing operation in each of the plurality of asynchronous comparators.

8. The decision-feedback equalizer according to claim 7, wherein the clock recovery circuit is configured to provide the clock signal depending on the comparison results of all of the asynchronous comparators and depending on at least one of an actual and previous output of the decision-feedback equalizer.

9. The decision-feedback equalizer according to claim 8, wherein a threshold level circuit is configured to calibrate threshold levels depending on at least one of (i) the respective comparison results of the asynchronous comparators and (ii) an actual or previous bit data output of the decision feedback equalizer.

10. The decision-feedback equalizer according to claim 1, wherein a threshold level circuit is connected to an input of each of the asynchronous comparators to apply corresponding threshold levels so that an input signal applied to the asynchronous comparators is compared with respect to the corresponding threshold levels.

11. The decision-feedback equalizer according to claim 10, wherein the threshold level circuit provides as threshold levels voltage levels of a first and a second logical state of the input signal for applying on two asynchronous comparators.

12. The decision-feedback equalizer according to claim 10, wherein the threshold level circuit provides as threshold levels four different voltage levels to four corresponding asynchronous comparators, wherein a first threshold level corresponding to a voltage level of a sum of a positive main-cursor threshold level and a positive post-cursor threshold level is applied to a first of the asynchronous comparators, wherein a second threshold level corresponding to a voltage level of a sum of a negative main-cursor threshold level and a positive post-cursor threshold level is applied to a second of the asynchronous comparators, wherein a third threshold level corresponding to a voltage level of a sum of a positive main-cursor threshold level and a negative post-cursor threshold level is applied to a third of the asynchronous comparators, and wherein a fourth threshold level corresponding to a voltage level of a sum of a negative main-cursor threshold level and a negative post-cursor threshold level is applied to a fourth of the asynchronous comparators.

13. The decision-feedback equalizer according to claim 12, wherein the first and second asynchronous comparators are connected with a first fastest decision detector and the third and fourth asynchronous comparators are connected with a second fastest decision detector, wherein respective outputs of the first and second fastest decision detectors are connected to corresponding inputs of a multiplexer, wherein one of the outputs of the first and second fastest decision detectors is selected depending on a level of a previous output data of the multiplexer.

14. The decision-feedback equalizer according to claim 1, wherein a threshold level circuit is connected to an input of each of the asynchronous comparators to apply corresponding threshold levels based on a main cursor threshold level and one of none, one and multiple post-cursor threshold levels so that an input signal applied to the asynchronous comparators is compared with respect to the corresponding threshold levels, and wherein a direct decision-feedback equalizer feedback circuit is provided to generate a direct feedback value to be applied on the input signal, wherein the direct feedback value is generated as a function of post-cursor threshold levels which are not used to generate the threshold levels to be applied to the asynchronous comparators.

15. A receiver for receiving an incoming data stream and for providing a stream of bit data outputs, the receiver comprising:
an input port operatively coupled with a communications channel conveying the incoming data stream; and
at least one decision-feedback equalizer, the decision-feedback equalizer comprising:

a plurality of asynchronous comparators, each of the asynchronous comparators being configured to receive an input signal and to directly provide a comparison result output in an asynchronous manner; and
a fastest decision detector, the fastest decision detector receiving at least a subset of the respective comparison result outputs of the plurality of asynchronous comparators and forwarding the comparison result of one of the plurality asynchronous comparators towards the output of the decision-feedback equalizer, the fastest decision detector being configured to select a given one of the plurality of asynchronous comparators as one which firstly provided its comparison result output.

16. The receiver of claim 15, further comprising a continuous time-linear equalizer coupled between the input port and the decision-feedback equalizer, the continuous time-linear equalizer being configured to equalize at least one signal portion of the input signal over a prescribed bandwidth to thereby compensate for attenuation of a transmission via the communications channel.

17. The receiver of claim 15, wherein each of at least a subset of the asynchronous comparators in the at least one decision-feedback equalizer comprises a regeneration circuit configured to amplify a voltage difference at its inputs and to provide a comparison result at its output.

18. The receiver of claim 15, wherein the fastest decision detector in the at least one decision-feedback equalizer comprises:
a pair of cross-coupled inverters configured to receive at least the subset of the respective comparison result outputs of the plurality of asynchronous comparators and to activate one branch of the pair of cross-coupled inverters once one of the asynchronous comparators provides a valid comparison result; and
a selection circuit configured to forward the comparison result to the output as a selected comparison result and to block comparison results as a function of the branch of the cross-coupled inverters which has been activated.

19. The receiver of claim 15, wherein the at least one decision-feedback equalizer further comprises a clock recovery circuit configured to provide a clock signal to at least a subset of the asynchronous comparators to simultaneously initiate a comparing operation in each of the plurality of asynchronous comparators.

20. The receiver of claim 15, wherein the at least one decision-feedback equalizer further comprises a threshold level circuit connected to an input of each of the asynchronous comparators, the threshold level circuit being configured to apply corresponding threshold levels so that an input signal applied to the asynchronous comparators is compared with respect to the corresponding threshold levels.

* * * * *